United States Patent
Song et al.

(10) Patent No.: US 7,058,873 B2
(45) Date of Patent: Jun. 6, 2006

(54) ENCODING METHOD USING A LOW DENSITY PARITY CHECK CODE WITH A COLUMN WEIGHT OF TWO

(75) Inventors: Hongwei Song, Pittsburgh, PA (US); Vijayakumar Bhagavatula, Upper St. Clair, PA (US); Jingfeng Liu, Shrewsbury, MA (US)

(73) Assignee: Carnegie Mellon University, Pittsburgh, PA (US)

( * ) Notice: Subject to any disclaimer, the term of this patent is extended or adjusted under 35 U.S.C. 154(b) by 444 days.

(21) Appl. No.: 10/289,780

(22) Filed: Nov. 7, 2002

(65) Prior Publication Data

US 2004/0093549 A1    May 13, 2004

(51) Int. Cl.
*H03M 13/11* (2006.01)
*H03M 13/29* (2006.01)
*H03M 13/45* (2006.01)

(52) U.S. Cl. ..................... 714/752; 714/780
(58) Field of Classification Search ............. 714/752, 714/780, 755
See application file for complete search history.

(56) References Cited

U.S. PATENT DOCUMENTS

| | | | |
|---|---|---|---|
| 4,295,218 A * | 10/1981 | Tanner | ............... 714/762 |
| 4,547,882 A * | 10/1985 | Tanner | ............... 714/755 |
| 5,563,897 A | 10/1996 | Pyndiah et al. | |
| 6,145,111 A | 11/2000 | Crozier et al. | |
| 6,163,870 A | 12/2000 | Luby et al. | |
| 6,195,777 B1 | 2/2001 | Luby et al. | |
| 6,539,367 B1 * | 3/2003 | Blanksby et al. | ............... 706/14 |
| 6,567,465 B1 * | 5/2003 | Goldstein et al. | ............ 375/222 |
| 6,789,227 B1 * | 9/2004 | De Souza et al. | ........... 714/804 |
| 2002/0186759 A1 * | 12/2002 | Goldstein et al. | ............ 375/222 |
| 2002/0188906 A1 * | 12/2002 | Kurtas et al. | ............... 714/755 |

OTHER PUBLICATIONS

Tanner, R., "A Recursive Approach to Low Complexity Codes", IEEE Transactions of Information Theory, vol. IT-27, No. 5, Sep. 1981, pp. 533-547.*

Tanner, R., "Minimum-Distance Bounds by Graph Analysis", IEEE Transactions on Information Theory, vol. 47, No. 2, Feb. 2001, pp. 808-821.*

Hu, X., et al., "Progressive Edge-Growth Tanner Graphs", IEEE GLOBECO '01, Nov. 2001, pp. 995-1001.*

Kschischang et al, "Factor Graphs and the Sum-Product Algorithm," *IEEE Trans. On Info. Theory*, vol. 47, No. 2, Feb. 2001, pp. 498-519.

(Continued)

*Primary Examiner*—Stephen M. Baker
(74) *Attorney, Agent, or Firm*—Kirkpatrick & Lockhart Nicholson Graham LLP (57) ABSTRACT

A method for communicating binary data and a digital communication system are presented. According to one embodiment, the method includes encoding a message word by multiplying the message word with a generator matrix, wherein the generator matrix multiplied by the transpose of a parity check matrix for a low density parity check code yields a null set, and wherein the parity check matrix has a column weight of two. Additionally disclosed is an encoding scheme based on a three-tier Tanner graph having a girth of twelve.

26 Claims, 9 Drawing Sheets

OTHER PUBLICATIONS

Galllagher, "Low-Density Parity-Check Codes," *IRE Trans. On Info. Theory*, Jan. 1962, pp. 21-28.

Song et al., "Iterative decoding for partial response (PR) equalized magneto-optical (MO) data storage channels," *IEEE Journal on Selected Areas in Communications*, pp. 774-782, Apr. 2001.

Song et al., "Low-Density Parity-Check (LDPC) Codes For Partial Response Equalized CAD-MO Recording," *International Symposium on Optical Memory*, Tapei, China, Oct. 2001.

Song et al., "Low Density Parity Check (LDPC) Code Concatenated with Generalized Partial Response (GPR) Equalizer for High-Capacity Magneto-Optical (MO) Recording Channels," *Japanese Journal of Applied Physics*, Mar. 2002.

* cited by examiner

$$\vec{H} = [M_1 | M_2 | M_3 | \ldots | M_{18} | M_{19} | M_{20}]$$

Column $n$

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 1 | 0 | 0 | 0 | 0 | 0 | 0 | 1 | 0 | 0 | 0 | 0 | 0 | 0 | 0 | 0 |
| 1 | 0 | 1 | 0 | 0 | 0 | 0 | 0 | 0 | 1 | 0 | 0 | 0 | 0 | 0 | 0 | 0 |
| 2 | 0 | 0 | 1 | 0 | 0 | 0 | 0 | 0 | 0 | 1 | 0 | 0 | 0 | 0 | 0 | 0 |
| 3 | 0 | 0 | 0 | 1 | 0 | 0 | 0 | 0 | 0 | 0 | 1 | 0 | 0 | 0 | 0 | 0 |
| 4 | 0 | 0 | 0 | 0 | 1 | 0 | 0 | 0 | 0 | 0 | 0 | 1 | 0 | 0 | 0 | 0 |
| 5 | 0 | 0 | 0 | 0 | 0 | 1 | 0 | 0 | 0 | 0 | 0 | 0 | 1 | 0 | 0 | 0 |
| 6 | 0 | 0 | 0 | 0 | 0 | 0 | 1 | 0 | 0 | 0 | 0 | 0 | 0 | 1 | 0 | 0 |
| 7 | 0 | 0 | 0 | 0 | 0 | 0 | 0 | 1 | 0 | 0 | 0 | 0 | 0 | 0 | 1 | 0 |
| 8 | 0 | 0 | 0 | 0 | 0 | 0 | 0 | 0 | 1 | 0 | 0 | 0 | 0 | 0 | 0 | 1 |
| 9 | 1 | 0 | 0 | 0 | 0 | 0 | 0 | 0 | 0 | 1 | 0 | 0 | 0 | 0 | 0 | 0 |
| 10 | 0 | 1 | 0 | 0 | 0 | 0 | 0 | 0 | 0 | 0 | 1 | 0 | 0 | 0 | 0 | 0 |
| 11 | 0 | 0 | 1 | 0 | 0 | 0 | 0 | 0 | 0 | 0 | 0 | 1 | 0 | 0 | 0 | 0 |
| 12 | 0 | 0 | 0 | 1 | 0 | 0 | 0 | 0 | 0 | 0 | 0 | 0 | 1 | 0 | 0 | 0 |
| 13 | 0 | 0 | 0 | 0 | 1 | 0 | 0 | 0 | 0 | 0 | 0 | 0 | 0 | 1 | 0 | 0 |
| 14 | 0 | 0 | 0 | 0 | 0 | 1 | 0 | 0 | 0 | 0 | 0 | 0 | 0 | 0 | 1 | 0 |
| 15 | 0 | 0 | 0 | 0 | 0 | 0 | 1 | 0 | 0 | 0 | 0 | 0 | 0 | 0 | 0 | 1 |

Row $v$

ENCODING METHOD USING A LOW DENSITY PARITY CHECK CODE WITH A COLUMN WEIGHT OF TWO

BACKGROUND OF THE BACKGROUND

Digital data transmitted over communication channels with impairments such as noise, distortions, and fading is inevitably delivered to the user with some errors. A similar situation occurs when digital data is stored on devices such as magnetic or optical media or solid-state memories that contain imperfections. The rate at which errors occur, referred to as the bit-error rate (BER), is a very important design criterion for digital communication links and for data storage. The BER is usually defined to be the ratio of the number of bit errors introduced to the total number of bits. Usually the BER must be kept smaller than a given preassigned value, which depends on the application. Error correction techniques based on the addition of redundancy to the original message can be used to control the error rate.

Figure 1:
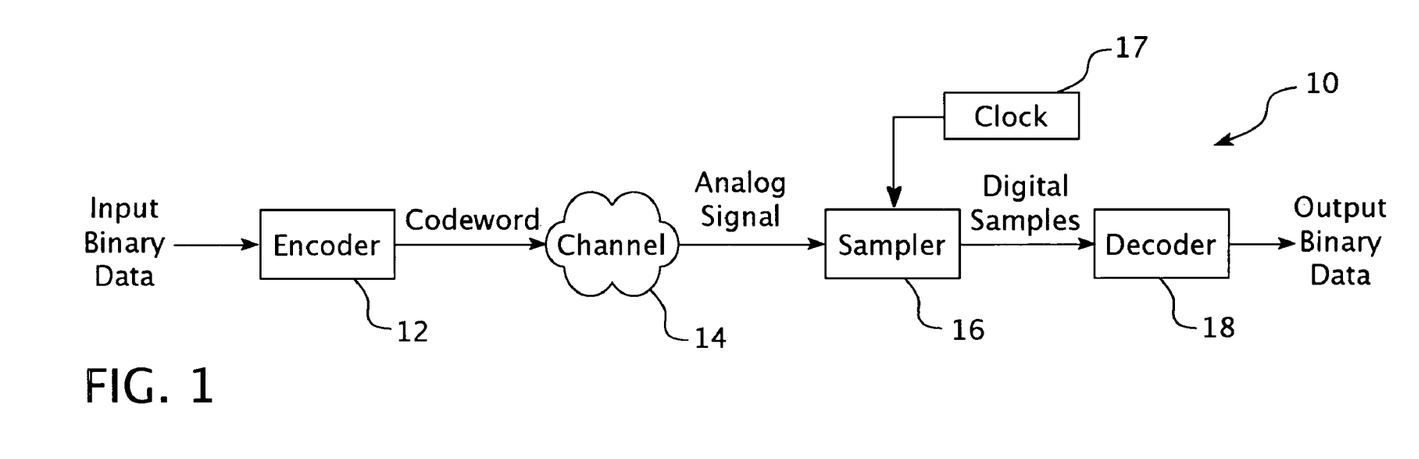
FIG. 1 is a diagram of a coded data system.

FIG. 1 is a block diagram of a system (e.g., data communications or data storage) 10 that illustrates the concept. The encoder 12 receives information bits from a source of digital data (not shown) and introduces redundant bits based on an error correction code. The combination of the data bits and the redundancy bits (which for block codes is called a "codeword") is transmitted over the channel 14. As described before, the channel 14 can represent a digital communication link (such as a microwave link or a coaxial cable) or a data storage system (such as a magnetic or optical disk drive). The system includes a sampler 16, which periodically samples the analog signal received over the channel 14, based on a clock signal received from a clock 17, to generate a digital sample of the received signal. The digital sample is provided to a decoder 18, which decodes the digital sample to, ideally, generate the exact data bit sequence provided to the encoder 12.

The amount of redundancy inserted by the code employed by the encoder is usually expressed in terms of the code rate R. This rate is the ratio of the number of information symbols (e.g., bits) l in a block to the total number of transmitted symbols n in the codeword. That is, n=l+number of redundant symbols. Or in other words, n>l, or equivalently, R=l/n<1.

The most obvious example of redundancy is the repetition of the bit in a message. This technique, however, is typically unpractical for obvious reasons. Accordingly, more efficient coding mechanisms for introducing redundancy have been developed. These include block codes and convolutional codes. With block codes, the encoder breaks the continuous sequence of information bits into l-bit sections or blocks, and then operates on these blocks independently according to the particular code used. In contrast, convolutional codes operate on the information sequence without breaking it up into independent blocks. Rather, the encoder processes the information continuously and associates each long (perhaps semi-infinite) information sequence with a code sequence containing more symbols.

Block codes are characterized by three parameters: the block length n, the information length l, and the minimum distance d. The minimum distance is a measure of the amount of difference between the two most similar codewords. Ideally, the minimum distance d is relatively large.

Conceptually, for block codes the encoder 12 of FIG. 1 operates by performing a matrix multiplication operation on the message word m, comprising the bits from the digital source to be transmitted. The message word m, which may be considered a 1×l matrix, where l is the number of bits in the message word m, multiplies a l×n generator matrix G, where n>l, to generate the codeword c, a 1×n matrix. Because matrix multiplication is sometimes a computationally intensive process, in practice other, less computationally intensive schemes that generate the same matrix multiplication product are sometimes used. As used herein, references to "matrix multiplication" (or just "multiplication") refer to any operation intended to produce the conceptual result of matrix multiplication, unless otherwise noted.

There are several known techniques for generating the generator matrix G. These include Hamming codes, BCH codes and Reed-Solomon codes. Another known code is a low density parity check (LDPC) code, developed by Gallager in the early 1960's. With block codes, a parity check matrix H of size (n−l)×n exists such that the transpose of H (i.e., $H^T$), when multiplied by G, produces a null set; that is: $G \times H^T = 0$. The decoder multiplies the received codeword c (m×G=c) by the transpose of H, i.e., $c \times H^T$. The result, often referred to as the "syndrome," is a 1×(n−k) matrix of all 0's if c is a valid codeword.

For LDPC codes, the parity check matrix H has very few 1's in the matrix. The term "column weight," often denoted as j, refers to the number of 1's in a column of H, whereas the term "row weight," denoted as k, refers to the number of 1's in a row. An LDPC code can be represented by a bipartite graph, called a Tanner graph, that has as many branches as the number of non-zero elements in the parity check matrix. Gallager showed that with a column weight $j \geq 3$, which means three or more 1's in each column of matrix H, the minimum distance d increases linearly with n for a given column weight j and row weight k, and that the minimum distance d for a column weight of j=2 can increase at most logarithmically with the block length.

For data storage applications, the corrected bit-error rate (BER) (i.e., BER after error correction) is preferably on the order of $10^{-12}$ to $10^{-15}$. Possible bit errors can be introduced in data storage applications because of mistracking, the fly-height variation of the read head relative to the recording medium, the high bit density, and the low signal-to-noise ratio (SNR). Today, the goal of data storage applications is to realize storage densities of 1 Tbit/in$^2$ and higher. Such a high bit density generates greater intersymbol interference (ISI), which complicates the task of realizing such low BERs. Further, with such high bit densities, the physical space each bit takes up on the recording medium becomes increasingly smaller, resulting in low signal strengths, thereby decreasing the SNR. In addition, computationally complex encoding schemes make the associated decoding operation computationally complex, making it difficult for the decoder for such a scheme to keep up with desired high data rates (such as 1 Gbit/s).

Accordingly, there exists a need for a code that can lead to corrected BERs of $10^{-12}$ to $10^{-15}$ despite the complications of large ISI and low SNR associated with going to higher bit densities, such as 1 Tbit/in$^2$. Further, there exists a need for such a coding scheme to permit encoding and decoding at high data rates.

BRIEF SUMMARY OF THE INVENTION

In one general respect, the present invention is directed to a method for encoding binary data. The encoding may be part of, for example, a data storage system or a data communications system. According to one embodiment, the method includes multiplying a message word with a generator matrix, wherein the generator matrix multiplied by the transpose of a parity check matrix for a low density parity check code yields a null set, and wherein the parity check matrix has a column weight of two. Further, the parity check matrix may be quasi-cyclic. The quasi-cyclic nature of the parity check matrix can simplify and thus speed up the encoder and decoder hardware. Such a quasi-cyclic parity check matrix, with a column weight of two, permits high rate codes of moderate codeword lengths and associated graphs that are free of 4-cycles and 6-cycles. In addition, utilizing such a quasi-cyclic parity check matrix with a column weight of two seems to offer more compatibility with, for example, outer Reed-Solomon codes. According to one embodiment, the parity check matrix may have a girth of twelve, where "girth" refers to the number of branches in the shortest cycle in the Tanner graph representing the code.

In another general respect, the present invention is directed to a coded data system. According to one embodiment, the system includes an encoder for encoding a message word by multiplying the message word with a generator matrix, wherein the generator matrix multiplied by the transpose of a parity check matrix for a low density parity check code yields a null set, and wherein the parity check matrix has a column weight of two. The parity check matrix may be quasi-cyclic. In addition, the system may further include a decoder in communication with the encoder via a channel. According to one embodiment, the parity check matrix may have a girth of twelve.

In another general respect, the present invention is directed to a method of encoding binary data including, according to one embodiment, receiving a message word and adding a plurality of redundancy bits to the first message word to thereby generate a codeword. The redundancy bits are added based on a three-tier Tanner graph having a girth of twelve. Such an encoding scheme facilitates pipelined processing.

BRIEF DESCRIPTION OF THE FIGURES

Embodiments of the present invention will be described in conjunction with the following figures, wherein.

DETAILED DESCRIPTION OF THE INVENTION

Figure 2:
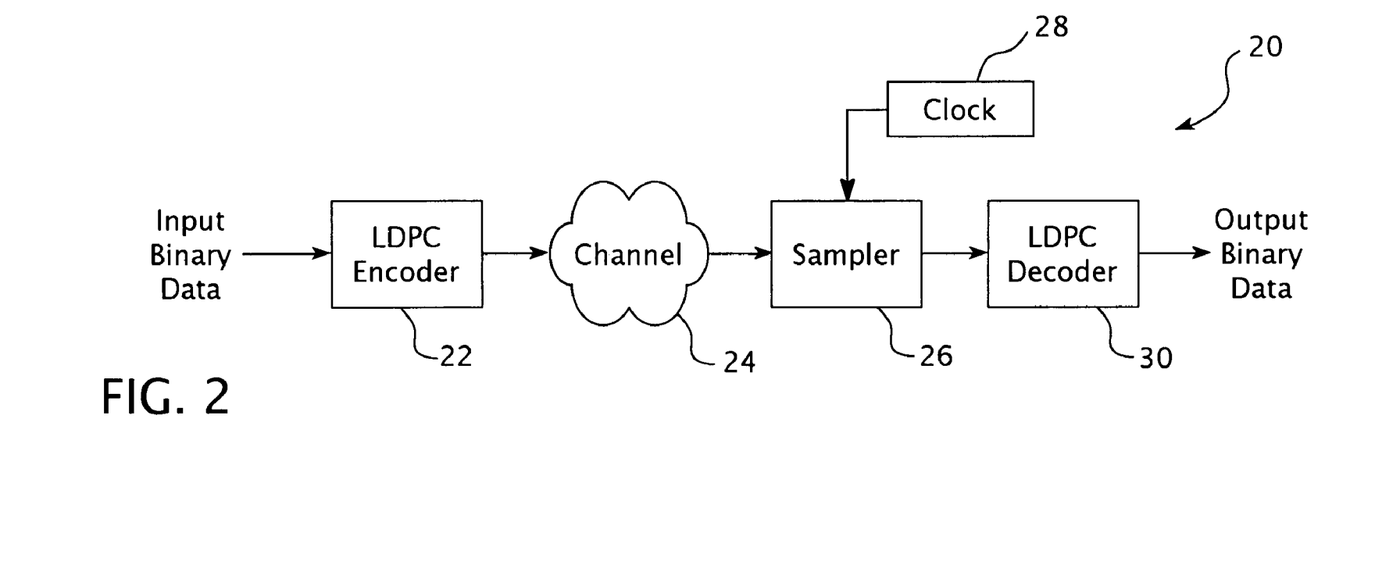
FIG. 2 is a diagram of a coded data system according to an embodiment of the present invention.

FIG. 2 is a diagram of a coded data system 20 according to an embodiment of the present invention. The system 20 includes a low density parity check (LDPC) encoder 22, a channel 24, a sampler 26, a clock 28, and a LDPC decoder 30. The coded data system 20 may be part of, for example, a data storage system or a digital communications system The input binary data may be a message word m of length l; that is, m is a 1×l matrix. The LDPC encoder 22 multiplies a generator matrix G by m to produce codeword c. The generator matrix G is a l×n matrix, where n>1. For certain applications, n may be on the order of several thousand, such as on the order of 4000. The code rate R=l/n. According to one embodiment, the LDPC encoder 22 may be implemented with a series of shift registers to perform encoding.

The codeword c is transmitted over the channel 24, which can include, for example, a digital communication link (such as a microwave link or a coaxial cable) or a data storage system (such as a magnetic or optical disk drive). The sampler 26 may periodically sample the analog signal received over the channel 24, based on a clock signal received from the clock 28, to generate digital samples of the received signal. The digital samples are provided to the LDPC decoder 30, which decodes the digital sample to, ideally, generate the exact data bit sequence m provided to the LDPC encoder 22. The LDPC decoder 30 decodes the received codeword c based on preexisting knowledge regarding the parity check matrix H. According to one embodiment, the LDPC decoder 30 may be implemented with a digital signal processor (DSP) employing soft iterative decoding according to, for example, a sum-product (sometimes referred to as a message passing) algorithm, as described in, for example, Kschischang et al., "Factor Graphs and the Sum-Product Algorithm," *IEEE Transactions on Information Theory*, 2001, which is incorporated herein by reference.

For LDPC systems, $G \times H^T = 0$, where H is the parity check matrix. This is the case for all linear block codes. According to an embodiment of the present invention, H is an (n–l)×n matrix having a column weight of two (i.e., j=2). That is, the parity check matrix H has two, and only two, 1's per column. In addition, the parity check matrix H may have the 1's placed in the matrix according to a predetermined distribution such that the 1's are not randomly located in the matrix.

Figure 3:
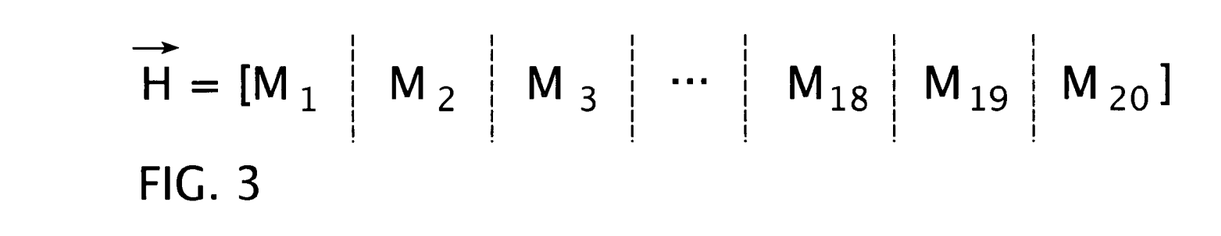
FIG. 3 illustrates a parity check matrix H having twenty sub-matrices, $M_{1-20}$.

Consider a parity check matrix H having v rows (0 to v–1) and n columns (0 to n–1), where n=rv and r is an integer greater than zero. That is, H may be considered to comprise r number of v×v sub-matrices, as illustrated in FIG. 3. In the example of FIG. 3, r=20, i.e., there are twenty v×v sub-matrices.

Figure 3A:
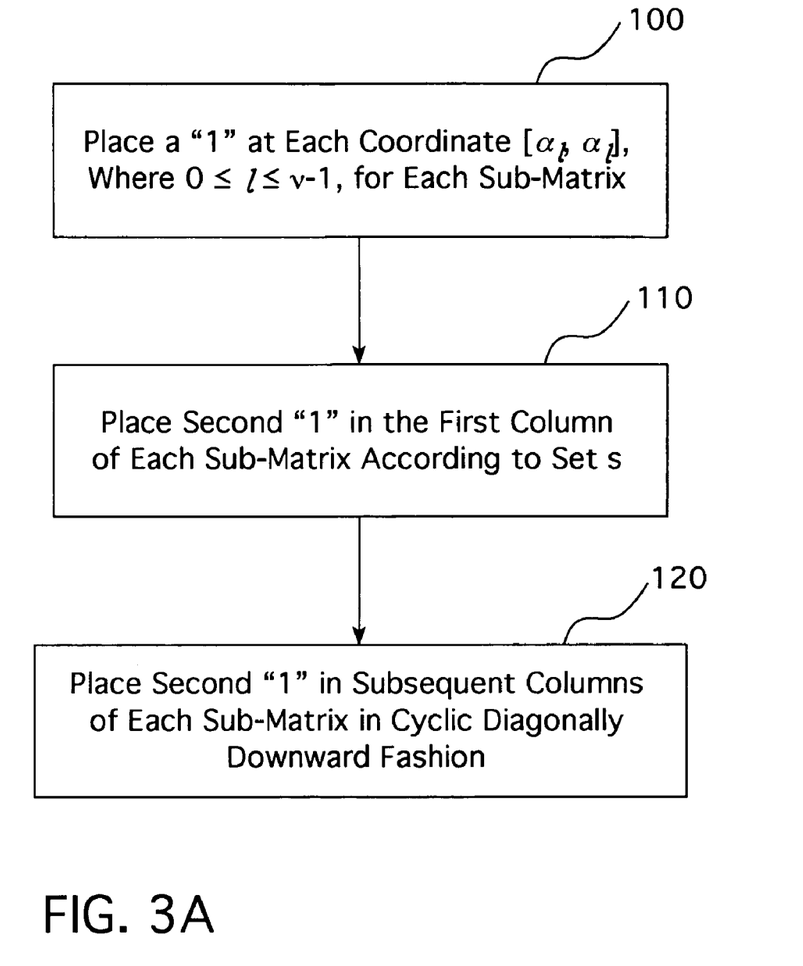
FIG. 3A illustrates a process for populating the parity check matrix H to realize a column weight j=2 according to one embodiment of the present invention.

FIG. 3A depicts a process for populating the parity check matrix H to realize a column weight j=2 according to one embodiment of the present invention. First, at step 100, a "1" may be placed at each coordinate $[\alpha_i, \alpha_i]$, where $0 \leq 1 \leq v-1$, for each sub-matrix $M_i$. For example, if the matrix has sixteen rows (rows 0 to v–1), then a "1" would be placed at coordinates [0,0], [1,1], [2,2], . . . [15,15] for each sub-matrix $M_i$. This is sometimes referred to as placing ones along the "identity line." Next, at block 110, a second "1" is placed in the first column (column n=0) for each of the sub-matrices $M_i$ according to a set s, defined as follows:

$$s = \{a_1, a_2, \ldots, a_r, 0 < a_1 < a_2 < \ldots < a_r < v\}.$$

Figure 4:
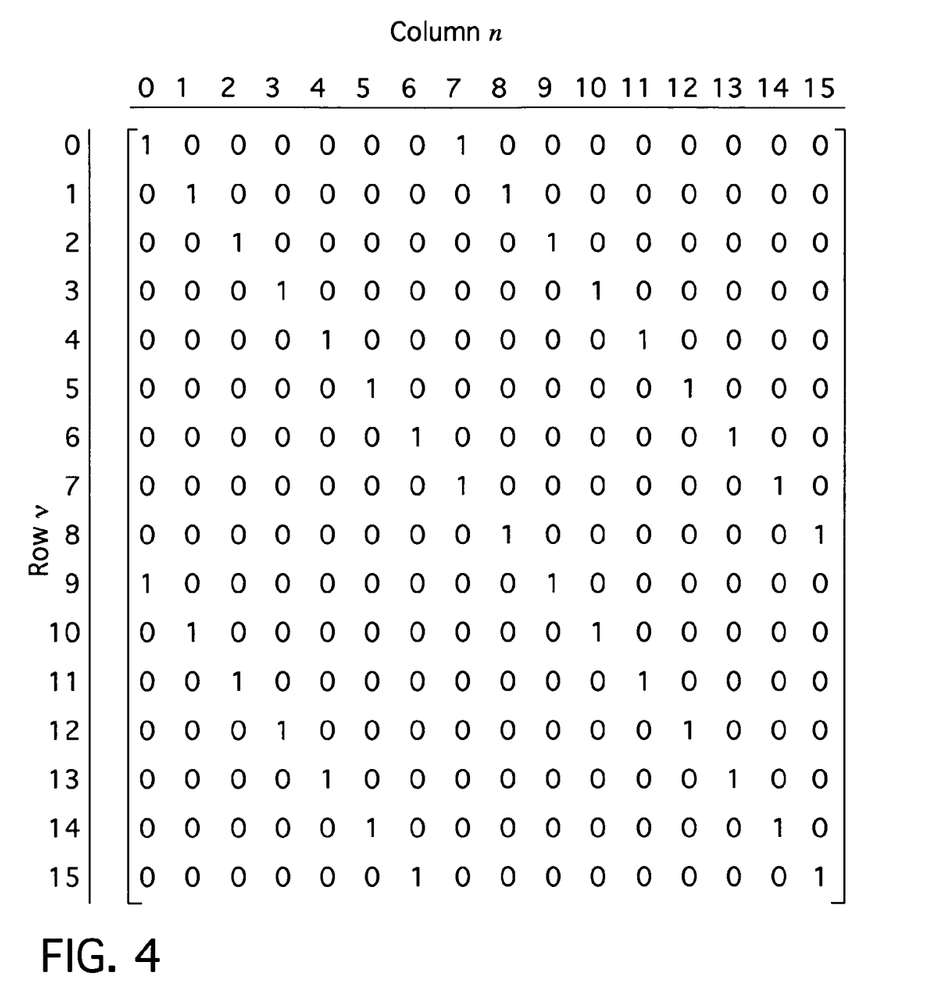
FIG. 4 illustrates a sub-matrix M, populated according to the process of FIG. 3A.
Figure 4A:
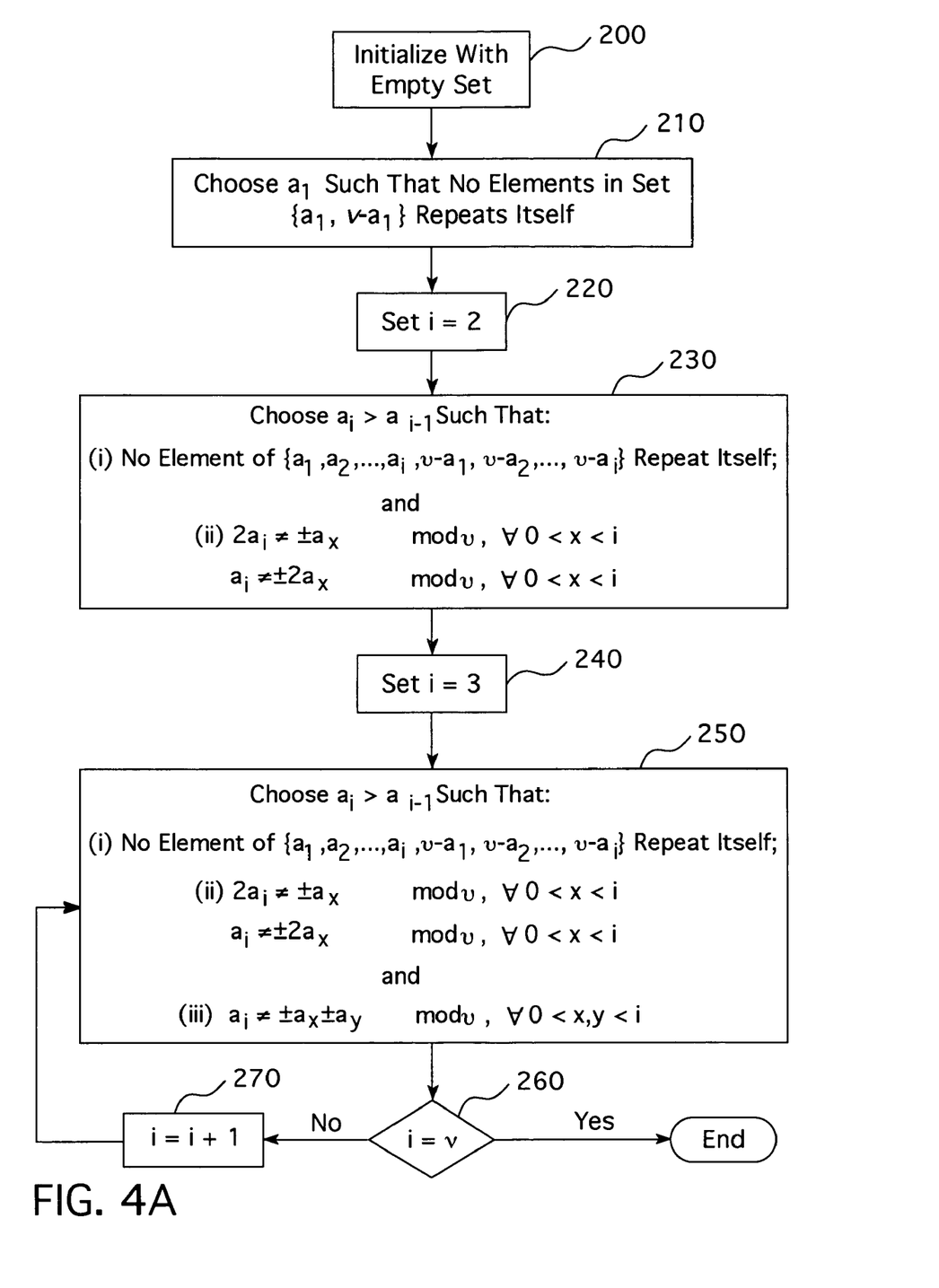
FIG. 4A is a flow chart illustrating the process for generating the elements of s, referred to in block 110 of FIG. 3A, according to one embodiment of the present invention.

FIG. 4A, discussed hereinbelow, describes how to generate the elements of s according to one embodiment of the present invention. Next, at step 130, for each sub-matrix $M_i$, 1's are placed in subsequent columns in a cyclic, diagonally downward fashion. That is, 1's are placed diagonally downward from the second "1" in the first column (n=0) (step 120), returning to the top row (v=0) after placing a "1" in the bottom row, and continuing diagonally downward again from the "1" in the top row. For example, assuming a sub-matrix having sixteen rows again (row v−1=15 being the bottom row), if at column n=8 a "1" is placed in row 15 (i.e., coordinate [8,15]), a "1" would be placed at coordinate [9,0], and continuing diagonally downward in subsequent columns. Accordingly, the 1's may be placed in the parity check matrix H in a quasi-cyclic (e.g., diagonally downward) fashion.

FIG. 4 depicts a sub-matrix $M_i$ populated according to the process of FIG. 3A. As can be seen in FIG. 4, the sub-matrix is a 16×16 matrix. One's are placed along the identity line, i.e., one's are placed at coordinates [0,0], [1,1], [2,2], . . . [15,15]. Also, set s (to be described in more detail hereinbelow) dictates that the second 1 in column n=0 be positioned at coordinate [0, 9], and 1's are placed in the subsequent columns in a diagonally downward fashion, returning to the top row at column n=7.

FIG. 4A is a flow chart illustrating the process for generating the elements of s according to one embodiment of the present invention. Recall that $$s = \{a_1, a_2, \ldots, a_r, 0 < a_1 < a_2 < \ldots < a_r < v\}$$

where the elements of s are the location of the second 1's in the n=0 column of each sub-matrix $M_{i,\ 0<i<r}$. As illustrated in FIG. 4A, the set s may be initialized with an empty set (i.e., s=Φ) at step 200. At step 210, $a_1$ is chosen such that no element of the set $\{a_1, v-a_1\}$ repeats itself. For example, for a matrix having v=16 rows, $a_1 \neq 8$. Next at step 220, i is set to two. At step 230, $a_{i,\ i=2}$ is chosen such that:

(i) no element of $\{a_1, a_2, \ldots, a_i, v-a_1, v-a_2, \ldots, v-a_i\}$ repeat itself, and (ii) $2a_i \neq \pm a_x$, mod v, $\forall 0 < x < i$
$a_i \neq \pm 2a_x$ mod v, $\forall 0 < x < i$ At block 240, i is set to equal 3. Next, at step 250, $a_{i=3}$ is chosen using the above-two constraints from step 230, with the additional constraint that:

(iii) $a_i \neq \pm a_x \pm a_y$, mod v, $\forall 0 < x, y < i$

Next, at step 260, it is determined if i=r. If not, i is incremented by one at step 270 and the process of choosing $a_i$ is repeated at step 250 until i=r. Once i=r, the process is complete.

Without loss of generality, choose $\alpha_1 = 1$ at step 210. Then a v×v square sub-matrix $M_1$ is obtained according to the process of FIG. 3A. After generating a set of index numbers s following the flow chart in FIG. 4A, we construct the parity check matrix M in the form of $M = [M_1\ M_2\ \ldots\ M_r]$. Notice that the parity check matrix M has row rank (v−1), thus, the LDPC code defined by the matrix M has codeword length n=rv, while (r−1)v+1 of them are information bits and the rest (v−1) bits are parity bits. Assume (r−1)v+1 information bits $m = [m_1\ m_2\ \ldots\ m_{(r-1)v+1}]$ are received, the encoding is performed as follows to compute the parity bits $x = [x_1\ x_2\ \ldots\ x_{v-1}]$.

$$M_1 = \begin{bmatrix} 1 & 1 & & & & & & & \\ & 1 & 1 & & & & & & \\ & & 1 & 1 & & & & & \\ & & & 1 & 1 & & & & \\ & & & & 1 & 1 & & & \\ & & & & & 1 & 1 & & \\ & & & & & & 1 & 1 & \\ 1 & & & & & & & & 1 \end{bmatrix}$$

Step 1. Calculate a vector p using, for example, a linear shift register.

$$p = \begin{bmatrix} p_1 \\ p_2 \\ \vdots \\ p_{v-1} \\ p_v \end{bmatrix} = [M_2\ M_3\ \cdots\ M_v] \begin{bmatrix} m_2 \\ m_3 \\ \vdots \\ m_{(v-1)v} \\ p_{(v-1)v+1} \end{bmatrix}$$

Step 2. Compute the parity bits x using sub-matrix $M_1$ and vector p as follows:

$$\begin{cases} x_{v-1} = m_1 \oplus p_{v-1} \\ x_{v-2} = x_{v-1} \oplus p_{v-2} \\ x_{v-3} = x_{v-2} \oplus p_{v-3} \\ \quad \cdots \\ x_1 = x_{v-2} \oplus p_1 \end{cases}$$

where $\oplus$ stands for XOR operation.

The above calculation of parity bits x may be readily implemented using, for example, a flip-flop circuit by initializing the register with information bit $m_1$ and input sequence p.

Using a parity check matrix H where the column weight j=2, as per the above construction, has the advantage of eliminating 4-cycles and 6-cycles in the associated Tanner graph. Typically, the larger the girth, the better because the decoder is using more iterations to decode the data.

In addition, because of the quasi-cyclic nature of the parity check matrix H, the present invention may permit the matrix H to be completely described by a small set of numbers, which may greatly reduce the memory and bandwidth issues involved in the hardware implementation of the encoder/decoder. Further, utilizing a column weight of two potentially results in less computation and less memory accesses by the encoder 22 and decoder 30 than with systems where j≧3. Additionally, simulation has indicated that using a parity check matrix H with a column weight of j=2 provides acceptable performance in terms of bit-error-rate (BER) at low signal-to-noise ratios (SNRs), at higher storage densities for digital recording channels, and at higher transmission rates for digital communication channels.

Figure 5:
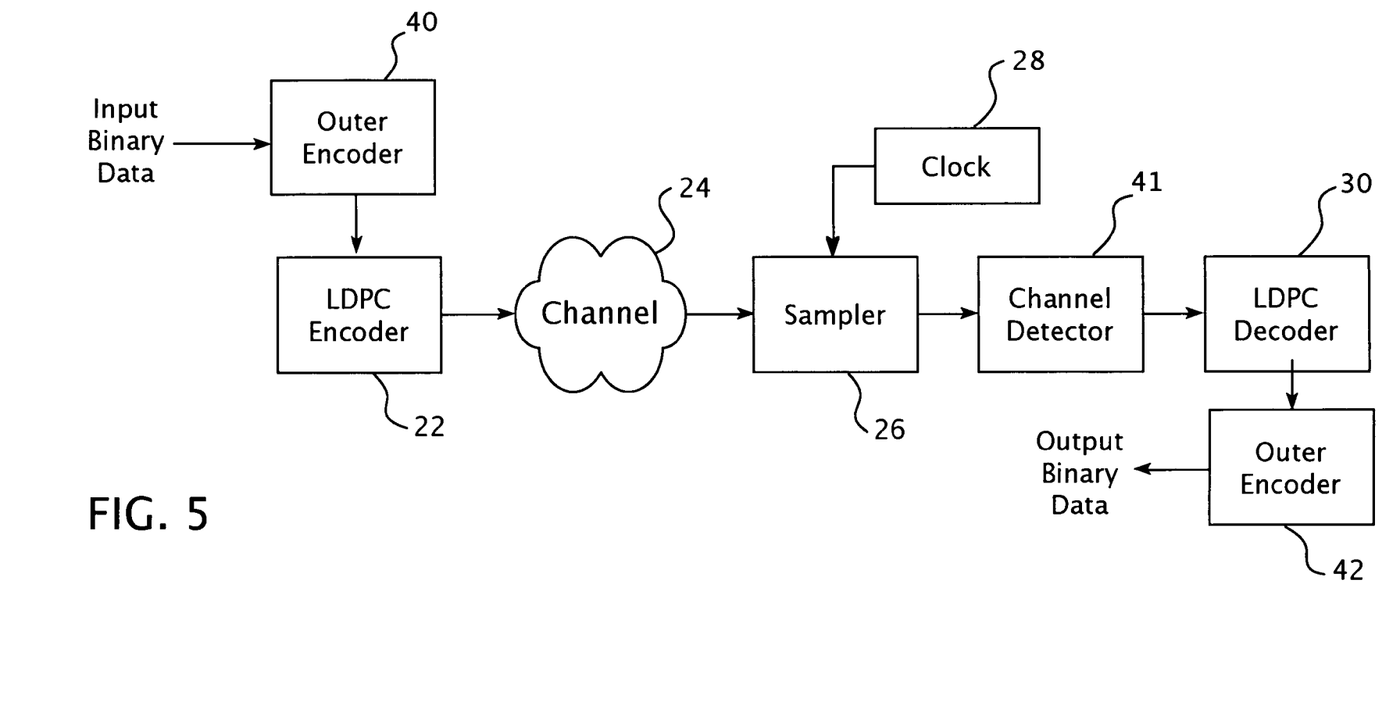
FIG. 5 is a diagram of a coded data system according to another embodiment of the present invention.

FIG. 5 is a diagram of the coded data system 20 according to another embodiment of the present invention. The coded data system 20 of FIG. 5 is similar to that of FIG. 2, except that the system 20 further includes an outer encoder 40 and an outer decoder 42. According to such a system, the outer encoder 40 may first encode the message word m to produce a first codeword $c_1$, and the LDPC encoder 22 (having a column weight of j=2) may further encode the fist codeword $c_1$ to generate a second codeword $c_2$. The decoding side may include a channel detector 41 between the sampler 26 and the LDPC decoder 30 to provide soft input (i.e., a value indicative of the likelihood of the bit is a 1 versus the likelihood it is a 0) to the LDPC decoder 30. The LDPC decoder 30 may first decode the soft input data from the channel detector 41 and the outer decoder 42 may further decode the output of the LDPC decoder 30. According to various embodiments, the channel detector 41 may be, for example, a low-density detector such as a sampler, or a high-density detector such as a Viterbi detector employing a soft-output Viterbi algorithm (SOVA).

According to one embodiment, the outer encoder 40 may be a Reed-Solomon encoder, i.e., an encoder that employs a Reed-Solomon error correction code. Reed-Solomon codes are described in Wicker et al., eds., *Reed-Solomon Codes and Their Applications,* IEEE Press, 1994, which is incorporated herein by reference. In addition, the outer decoder 42 may be a Reed-Solomon decoder that is provisioned to decode the redundancy introduced by the Reed-Solomon outer encoder 40.

According to another embodiment, the outer encoder 40 may be LDPC code encoder where the column weight $j \geq 3$. For such an embodiment, the outer decoder 42 may be a LDPC decoder provisioned to decode the redundancy introduced by the outer LDPC encoder 40.

Figure 6A:
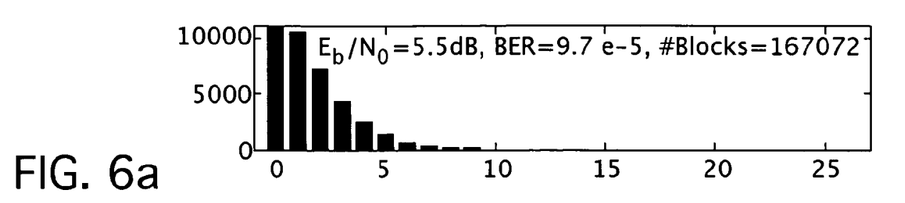
FIGS. 6a–c are histograms from simulations showing the number of blocks having different numbers of errors using a LDPC code with a column weight of j=2 as a function signal-to-noise ratio, bit error rate, and the total number of blocks simulated.
Figure 6B:
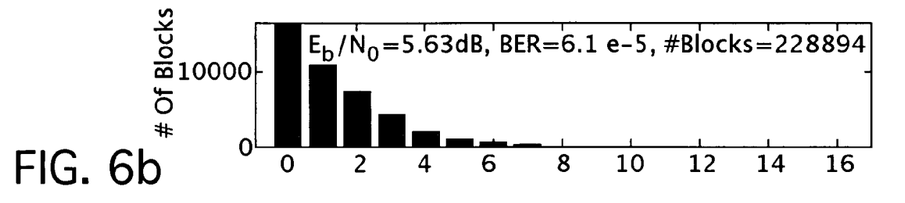
Figure 6C:
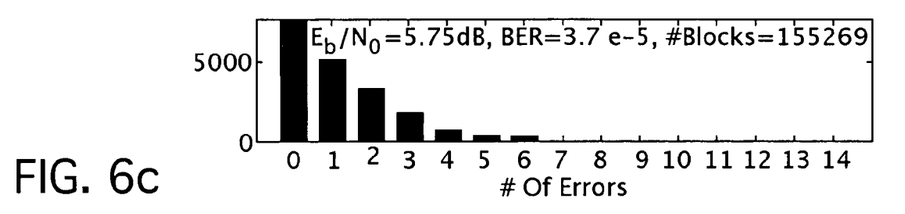

FIGS. 6*a–c* and 7*a–c* illustrate the compatibility of utilizing a LDPC encoder 22 with a column weight of j=2 in conjunction with an outer Reed-Solomon decoder 40. FIGS. 6*a–c* are histograms showing the number of blocks (y-axis) having different numbers of errors (x-axis) using a LDPC code with a column weight of j=2 as a function SNR ($E_b/N_0$), bit error rate (BER), and the total number of blocks simulated. For FIG. 6*a*, $E_b/N_0$=5.5 dB, BER=$9.7 \times 10^{-5}$, and the total number of blocks is 167,072. For FIG. 6*b*, $E_b/N_0$=5.63 dB, BER=$6.1 \times 10^{-5}$, and the total number of blocks is 228,894. For FIG. 6*c*, $E_b/N_0$=5.75 dB, BER=$3.7 \times 10^{-5}$, and the total number of blocks is 155,269. As illustrated in these figures, the large majority of blocks have zero errors. In addition, no blocks exhibit more than 30 errors for this particular example.

Figure 7A:
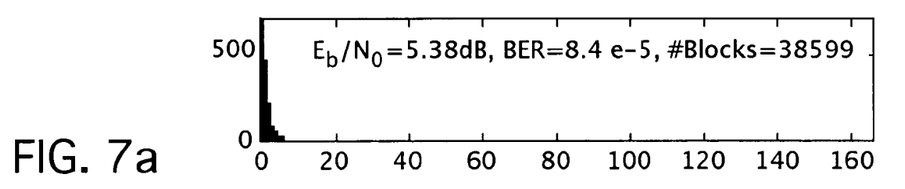
FIGS. 7a–c are histograms from simulations showing the number of blocks having different numbers of errors using a LDPC code with a column weight of j=3 as a function signal-to-noise ratio, bit error rate, and the total number of blocks simulated.
Figure 7B:
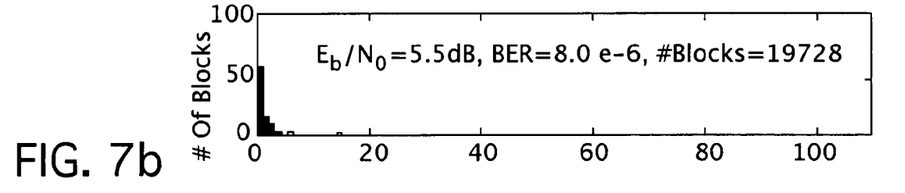
Figure 7C:
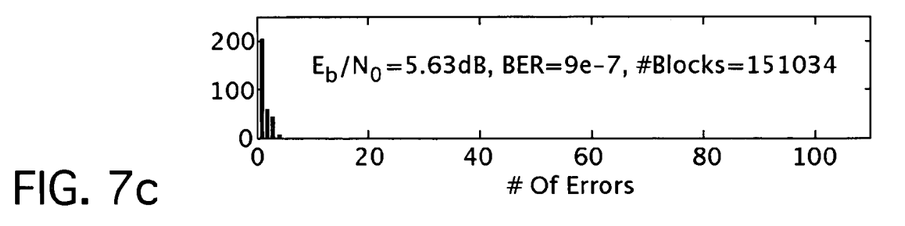

FIGS. 7*a–c* illustrate similar block statistics for a LDPC code with a column weight of j=3. These figures illustrate that some block have more than 100 errors. For example, FIG. 7*b*, which simulates 19,728 blocks, shows that two blocks have more than 100 errors, which may be beyond the error correction capability of an outer Reed-Solomon code. In contrast, as mentioned previously, only up to 25 errors per block are observed for the j=2 LDPC code among 167,072 simulated blocks. (See FIG. 6*a*). Thus, LDPC codes with j=2 seem to offer more compatibility with an outer Reed-Solomon code for the same SNR.

Figure 8:
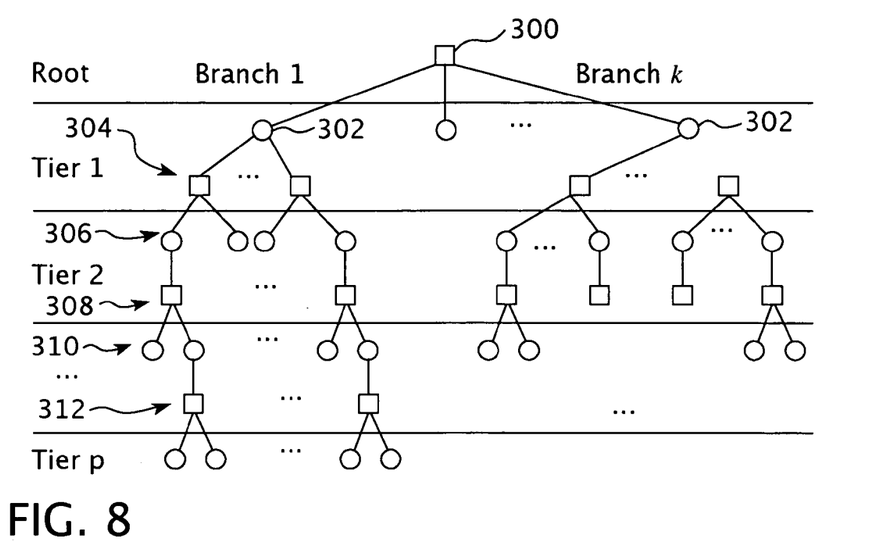
FIG. 8 is a diagram of a p-tier Tanner graph for any (n, j, k) LDPC code.

As another aspect of the present invention, consider a p-tier Tanner graph for any (n, j, k) LDPC code, as shown in FIG. 8, where n is the number of columns of the parity check matrix H, j is the column weight, and k is the row weight (number of 1's in each row). An arbitrary check node 300 (denoted by □) at the root is connected to k bit nodes 302 (denoted by ○) on the first tier. Each of these bit nodes is connected to (j–1) check nodes at the lower level. Each of the k(j–1) check nodes at this lower level is connected to (k–1) bit nodes on the second tier, with each node giving rise to (j–1) check nodes. Thus, there are k(k–1)(j–1) bit nodes and $k(k-1)(j-1)^2$ check nodes on the second tier. Similarly, there are $k(k-1)^{r-1}(j-1)^{r-1}$ bit nodes and $k(k-1)^{r-1}(j-1)^r$ check nodes on the $i^{th}$ tier. To construct a graph of girth g=4p, all the bit nodes on the p-tier graph must be distinct. Thus, $$n \geq k(k-1)^{p-1}(j-1)^{p-1} + \ldots + k(k-1)(j-1) + k \qquad (1)$$

Similarly, to construct graph of girth g=4p+2, all the check nodes on the p-tier graph must be distinct, which gives the following lower bound on the codeword length, $$n \geq [k^2(k-1)^{p-1}(j31\ 1)^p + \ldots + k^2(j31\ 1) + k]/j \qquad (2)$$

Figure 9:
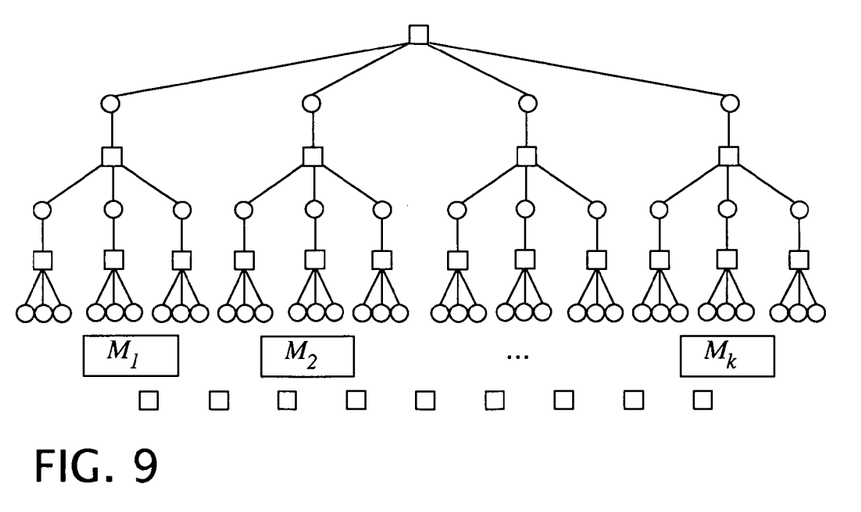
FIG. 9 is a diagram of a 3-tier Tanner graph having a girth of twelve.

To construct graphs having girth g=12, all the bit nodes on the 3-tier graph must be distinct, as shown in FIG. 9. For j=2 regular LDPC codes, there are $k(k-1)^2$ bit nodes on the third tier, which require $(k-1)^2$ check nodes on the same tier to form a regular graph. The $k(k-1)^2$ bit nodes can be divided into k groups as the check node at the root gives rise to k bit nodes on the first tier. To build a graph of girth g=12, connections between the bit nodes and check nodes on the third tier must be established.

If k–1 is a prime number, square matrices $Q_i, i=1,2,\ldots,k$ of size (k–1)×(k–1) constructed following the steps described below, for example, can be used to establish the connections to avoid short cycles of length 10 or less.

Step 1. Find a primitive element α for the Galois Field GF(k–1). Primitive elements can be found in references such as *Error Control Coding,* by S. Lin and D. Costello, Prentice-Hall, 1983, which is incorporated herein by reference.

Step 2. Let $$Q_1 = \begin{bmatrix} 1 & k & \ldots & (k-1)(k-2)+1 \\ 2 & k+1 & \ldots & (k-1)(k-2)+2 \\ \ldots & \ldots & \ldots & \ldots \\ k-1 & 2(k-1) & \ldots & (k-1)^2 \end{bmatrix}$$

and $$Q_2 = Q_1^T = \begin{bmatrix} 1 & 2 & \ldots & k-1 \\ k & k+1 & \ldots & 2(k-1) \\ \ldots & \ldots & \ldots & \ldots \\ (k-1)(k-2)+1 & (k-1)(k-2)+2 & \ldots & (k-1)^2 \end{bmatrix}$$

Step 3. Form column vectors $\overline{\omega}_i$, i=3,4,...,k of size (k–1)×1.

$$\overline{\omega}_i = \begin{bmatrix} \varpi_{i,1} \\ \varpi_{i,2} \\ \varpi_{i,3} \\ \vdots \\ \varpi_{i,(k-1)} \end{bmatrix} = \begin{bmatrix} 0 \\ \alpha^{0+(i-3)} \\ \alpha^{1+(i-3)} \\ \vdots \\ \alpha^{k-3+(i-3)} \end{bmatrix} \mod(k-1)$$

Step 4. Construct matrices $Q_i, i=3,4,\ldots,k$ $$Q_i = Q_2 \Theta \overline{\omega}_i,$$

where Θ denotes left circular shift operation, i.e., the first row in $Q_i$ is obtained by $\overline{\omega}_{i,1}$ left circular shifts of the first row in $Q_2$, the second row in $Q_i$ is obtained by $\overline{\omega}_{i,2}$ left circular shifts of the second row in $Q_2$, etc.

Step 5. Connections between the bit nodes in the ith group and the check nodes on the third tier are established according to the mapping matrices $Q_i$, i=1,2,...,k. Without loss of generality, the positions of the check nodes in the bottom tier can be ordered as 1, 2, ..., $(k-1)^2$ from left to right. We read out the $(k-1)^2$ numbers in matrix $Q_i$ column by column to get a $1 \times (k-1)^2$ vector $[q_1\ q_2\ \ldots\ q_{(k-1)^2-1}\ q_{(k-1)^2}]$, and connect $q_1$ th check node with the first bit node in ith group, $q_2$ th check node with the second bit node in ith group, so on and so forth. $q_{(k-1)^2}$ th check node is connected with $(k-1)^2$ th bit node in ith group.

Figure 10:
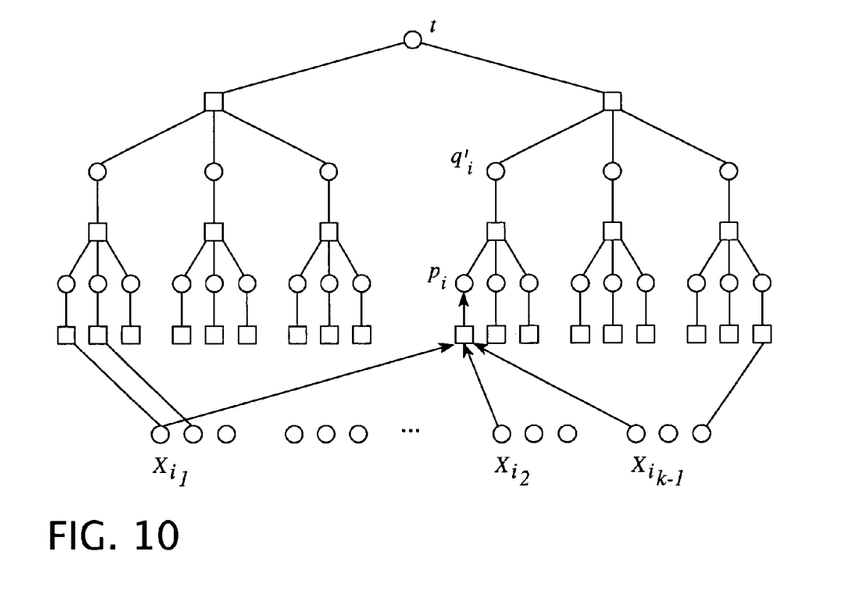
FIG. 10 is a diagram of a Tanner graph having a girth of twelve and starting with a bit node.

Starting with an arbitrary bit node, the Tanner graph in FIG. 9 can be represented in the form of a graph in FIG. 10. It can be shown that the Tanner graph of FIG. 10 has $(k-1)^3$ independent bit nodes, i.e., the cycle code constructed from the graph has $(k-1)^3$ information bits. Without loss of generality, suppose the $(k-1)^3$ bit nodes on the third tier are information bits, then the bits on the second tier can be computed as $$p_i = x_{i_1} \oplus x_{i_2} \oplus \ldots \oplus x_{i_{k-1}},\ i=1,2,\ldots,2(k-1)^2$$

where $x_{i_1}, x_{i_2}, \ldots, x_{i_{k-1}}$ are the bits on the bottom tier sharing the same check node with bit $p_i$. In a similar fashion, the bits on the first tier $q_{i'}$, can be computed from the bits $p_i$s, $$q_{i'} = p_{i'_1} \oplus p_{i'_2} \oplus \ldots \oplus p_{i'_{k-1}}, i=1,2,\ldots,2(k-1)$$

where $p_{i'_1}, p_{i'_2}, \ldots, p_{i'_{k-1}}$ are the bits on the second tier sharing the same check node with bit $q_{i'}$. The top bit t is obtained from the $q_i$s on either one of the two branches as $$\begin{aligned}t &= q_1 \oplus q_2 \oplus \cdots \oplus q_{k-1} \\ &= p_1 \oplus p_2 \oplus \cdots \oplus p_{(k-1)^2} \\ &= x_1 \oplus x_2 \oplus \cdots \oplus x_{(k-1)^3}\end{aligned}$$

Assume the $(k-1)^3$ bit nodes on the third tier are information bits, such as, for example, from a received message word. Suppose the parity bit $p_i$ on the second tier share the same check node with bit nodes $x_{i_1}, x_{i_2}, x_{i_3}$, on the third tier. It can be calculated by $p_i = x_{i_1} \oplus x_{i_2} \oplus x_{i_3}$. The other parity bits on the second tier can be figured out in the same way. Once the bits on the second tier are known, the parity bits on the first tier can be computed using the bits on the second tier. In like manner, the parity bit on the root can be obtained.

As described above, the encoding of cycle codes is based on the parity check matrix. This is particularly important for iterative soft decoding, where the decoding process is also based on the parity check matrix. Thus, the encoding and decoding can be unified and performed more efficiently in hardware implementation without allocating additional resources to compute the generator matrix which is often used for encoding.

Figure 11:
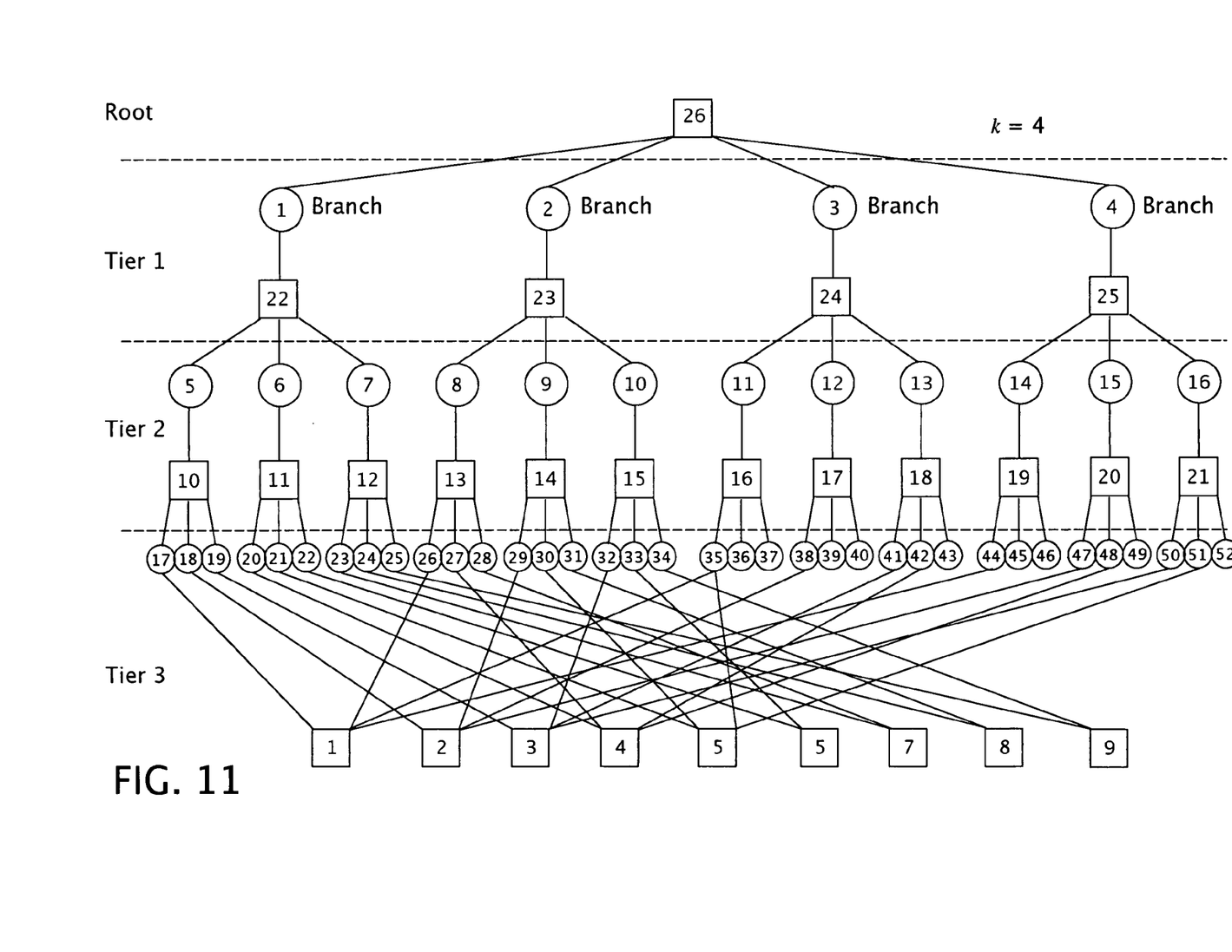
FIG. 11 is a Tanner graph illustrating an example per an embodiment of the present invention.

Consider the following example with reference to FIG. 11.

EXAMPLE

Construct a Column Weight j=2 LDPC Code with k=4, Girth g=12.

Step 1. Find a primitive element $\alpha$ for the GF(k−1=3). Easy to check $\alpha=2$ is a primitive element for GF(3).

Step 2. Construct 3×3 matrices $Q_1$ and $Q_2$ as follows:

$$Q_1 = \begin{bmatrix} 1 & 4 & 7 \\ 2 & 5 & 8 \\ 3 & 6 & 9 \end{bmatrix} \text{ and } Q_2 = Q_1^T = \begin{bmatrix} 1 & 2 & 3 \\ 4 & 5 & 6 \\ 7 & 8 & 9 \end{bmatrix}$$

Step 3. Form column vector $$\varpi_i = \begin{bmatrix} \varpi_{i,1} \\ \varpi_{i,2} \\ \varpi_{i,3} \end{bmatrix} = \begin{bmatrix} 0 \\ 2^{i-3} \\ 2^{i-2} \end{bmatrix} \mod(k-1), i=3,4.$$

mod $(k-1)$, i=3,4.

Therefore, $$\varpi_3 = \begin{bmatrix} 0 \\ 1 \\ 2 \end{bmatrix} \text{ and } \varpi_4 = \begin{bmatrix} 0 \\ 2 \\ 1 \end{bmatrix}$$

Step 4.

$$Q_3 = Q_2 \Theta \begin{bmatrix} 0 \\ 1 \\ 2 \end{bmatrix} = \begin{bmatrix} 1 & 2 & 3 \\ 5 & 6 & 4 \\ 9 & 7 & 8 \end{bmatrix},$$

i.e., [5 6 4] is obtained by 1 left circular shift of [4 5 6], [9 7 8] is obtained by 2 left circular shifts of [7 8 9].

$$Q_4 = Q_2 \Theta \begin{bmatrix} 0 \\ 2 \\ 1 \end{bmatrix} = \begin{bmatrix} 1 & 2 & 3 \\ 6 & 4 & 5 \\ 8 & 9 & 7 \end{bmatrix},$$

i.e., [6 4 5] is obtained by 2 left circular shift of [4 5 6], [8 9 7] is obtained by 1 left circular shifts of [7 8 9].

Step 5. Make the connections according to the mapping matrices.

i=1: connect the bit nodes in the $1^{st}$ group to the check nodes.

Read out the $(k-1)^2=9$ numbers in matrix $Q_1$ column by column, resulting in [1 2 3 4 5 6 7 8 9], and connect the $1^{st}$ check node with the $1^{st}$ bit node, the $2^{nd}$ check node with the $2^{nd}$ bit node, ..., the $9^{th}$ check node with the $9^{th}$ bit node.

i=2: connect the bit nodes in the $2^{nd}$ group to the check nodes.

Read out the $(k-1)^2=9$ numbers in matrix $Q_2$ column by column, resulting in [1 4 7 2 5 8 3 6 9], and connect the $1^{st}$ check node with the $1^{st}$ bit node, the $4^{th}$ check node with the second bit node, the $7^{th}$ check node with the $3^{rd}$ bit node, ..., the $9^{th}$ check node with the $9^{th}$ bit node.

i=3: connect the bit nodes in the $3^{rd}$ group to the check nodes.

Read out the $(k-1)^2=9$ numbers in matrix $Q_3$ column by column, resulting in [1 5 9 2 6 7 3 4 8], and connect the $1^{st}$ check node with the $1^{st}$ bit node, the $5^{th}$ check node with the $2^{nd}$ bit node, the $9^{th}$ check node with the $3^{rd}$ bit node, ..., the $8^{th}$ check node with the $9^{th}$ bit node.

Finally, for i=4, connect the bit nodes in the $4^{th}$ group to the check nodes according to $Q_4$, i.e., using vector [1 6 8 2 4 9 3 5 7].

Once the connections are established, we may label the check nodes and bit nodes as shown, for example, in FIG. 11 to get a parity check matrix $M_1$ of dimension 26×52, where the dots represent 1's in the matrix.

As is evident from the above example, an LDPC encoder can add redundancy bits to a received message word based on such a three-tier Tanner graph with a girth g=12. Moreover, the three-tier Tanner graph encoding scheme may facilitate pipelined processing by the encoder. That is, the encoder may operate on a first received message word at the lowest (third) tier of the Tanner graph (see FIG. 10) during a first time period. During the next time period, the second tier of the Tanner graph may operate on the output of the third tier from the first received message word, and simultaneously the third tier may operate on a second received message word, and so on. Accordingly, the encoder may simultaneously encode three different message words.

Although the present invention has been described herein with respect to certain embodiments, those of ordinary skill in the art will recognize that many modifications and variations of the present invention may be implemented. The foregoing description and the following claims are intended to cover all such modifications and variations.

What is claimed is:

1. A method for encoding binary data, comprising multiplying a message word with a generator matrix, wherein the generator matrix multiplied by the transpose of a parity check matrix for a low density parity check code yields a null set, and wherein the parity check matrix has a column weight of two and a girth of twelve.

2. The method of claim 1, wherein the parity check matrix is structured.

3. The method of claim 2, wherein the parity check matrix is quasi-cyclic.

4. The method of claim 3, wherein the parity check matrix has an even number of rows.

5. The method of claim 4, further comprising decoding the message word after encoding.

6. The method of claim 5, wherein decoding the message includes employing soft iterative decoding.

7. A coded data system, comprising an encoder for encoding a message word by multiplying the message word with a generator matrix, wherein the generator matrix multiplied by the transpose of a parity check matrix for a low density parity check code yields a null set, and wherein the parity check matrix has a column weight of two and a girth of twelve.

8. The system of claim 7, wherein the parity check matrix is structured.

9. The system of claim 8, wherein the parity check matrix is quasi-cyclic.

10. The system of claim 9, wherein the parity check matrix has an even number of rows.

11. The system of claim 7, further comprising a decoder in communication with the encoder via a channel.

12. The system of claim 11, wherein the decoder includes a soft iterative decoding decoder.

13. A coded data system, comprising:
an encoder for encoding a message word by multiplying the message word with a generator matrix, wherein the generator matrix multiplied by the transpose of a quasi-cyclic parity check matrix for a low density parity check code yields a null set, and wherein the parity check matrix has a column weight of two and a girth of twelve;
a decoder in communication with the encoder via a channel.

14. A coded data system, comprising:
means for encoding a message word by multiplying the message word with a generator matrix, wherein the generator matrix multiplied by the transpose of a parity check matrix for a low density parity check code yields a null set, and wherein the parity check matrix has a column weight of two and a girth of twelve; and
means for decoding the message word in communication with the means for encoding via a channel.

15. The system of claim 14, wherein the parity check matrix is structured.

16. The system of claim 15, wherein the parity check matrix is quasi-cyclic.

17. The system of claim 16, wherein the means for decoding include means for soft iterative decoding of the message word.

18. A coded data system, comprising:
a first encoder for encoding a message word according to an error correction code to thereby generate a first codeword; and
a second encoder for encoding the first codeword by multiplying the first codeword with a generator matrix, wherein the generator matrix multiplied by the transpose of a parity check matrix for a low density parity check code yields a null set, and wherein the parity check matrix has a column weight of two and a girth of twelve.

19. The system of claim 18, wherein the first encoder is for encoding the message word according to a Reed-Solomon error correction code.

20. The system of claim 19, wherein the first encoder is for encoding the message word according to a low density parity check code having a column weight equal to or greater than three.

21. The system of claim 18, wherein the parity check matrix is structured.

22. The system of claim 18, wherein the parity check matrix is quasi-cyclic.

23. The system of claim 18, further comprising:
a first decoder in communication with the second encoder via a channel; and
a second decoder in communication with the first decoder.

24. The system of claim 23, wherein the first decoder includes a soft iterative decoding decoder.

25. A method of encoding binary data, comprising:
receiving a first message word; and
adding a first plurality of redundancy bits to the first message word to thereby generate a first codeword, wherein adding the first plurality of redundancy bits includes adding a first plurality of redundancy bits based on a three-tier Tanner graph having a girth of twelve, wherein adding the first plurality of redundancy bits based on the three-tier Tanner graph includes:
operating on the first message word at a first tier of the three-tier Tanner graph during a first time period;
operating on an output from the first tier at a second tier of the Tanner graph during a second time period; and
operating on an output from the second tier at a third tier of the Tanner graph during a third time period.

26. The method of claim 25, further comprising:
receiving a second message word; and
adding a second plurality of redundancy bits to the second message word bits based on the three-tier Tanner graph to thereby generate a second codeword, wherein adding the second plurality of redundancy bits includes:
operating on the second message word at the first tier of the three-tier Tanner graph during the second time period;
operating on an output from the first tier at the second tier of the Tanner graph during the third time period; and operating on an output from the second tier at the third tier of the Tanner graph during a fourth time period.

* * * * *